(12) United States Patent
Winslow

(10) Patent No.: US 8,427,257 B2
(45) Date of Patent: Apr. 23, 2013

(54) BROADSIDE-COUPLED TRANSFORMERS WITH IMPROVED BANDWIDTH

(75) Inventor: Thomas A. Winslow, Salem, VA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 131 days.

(21) Appl. No.: 13/096,371

(22) Filed: Apr. 28, 2011

(65) Prior Publication Data

US 2012/0206215 A1  Aug. 16, 2012

Related U.S. Application Data

(60) Provisional application No. 61/441,823, filed on Feb. 11, 2011.

(51) Int. Cl.
*H03H 7/38* (2006.01)

(52) U.S. Cl.
USPC .......................................................... 333/33

(58) Field of Classification Search ................. 333/33, 333/34, 35, 32, 26, 25; 336/182, 184, 186
See application file for complete search history.

(56) References Cited

U.S. PATENT DOCUMENTS 7,724,484 B2 * 5/2010 Bahl ............................... 361/56

* cited by examiner

*Primary Examiner* — Stephen Jones
(74) *Attorney, Agent, or Firm* — Christopher P. Maiorana, PC

(57) ABSTRACT

A monolithic microwave integrated circuit (MMIC) compatible broadside-coupled transformer including (i) a first transmission line, (ii) a second transmission line, and (iii) a third transmission line. The first and the second transmission lines generally form the broadside-coupled transformer. The third transmission line is generally connected in series with the broadside-coupled transmission line forming a ground return path of the broadside-coupled transformer.

20 Claims, 11 Drawing Sheets

BROADSIDE-COUPLED TRANSFORMERS WITH IMPROVED BANDWIDTH

RELATED APPLICATIONS

This application claims the benefit of U.S. Provisional Application No. 61/441,823, filed Feb. 11, 2011 and is hereby incorporated by reference in its entirety.

FIELD OF THE INVENTION

The present invention relates to impedance transformers generally and, more particularly, to a method and/or apparatus for implementing broadside-coupled transformers with improved bandwidth.

BACKGROUND OF THE INVENTION

The impedance transformer is an important, but little used, tool for monolithic microwave integrated circuit (MMIC) designers. Monolithic microwave integrated circuit (MMIC) compatible transformers offer a significant improvement in the ability to impedance match high power amplifiers over a broader frequency range compared to standard filter (low pass/band pass) type matching networks. However, conventional MMIC compatible broadside-coupled transformers suffer from a resonance that limits the high frequency range of operation.

SUMMARY OF THE INVENTION

The present invention concerns a monolithic microwave integrated circuit (MMIC) compatible broadside-coupled transformer including (i) a first transmission line, (ii) a second transmission line, and (iii) a third transmission line. The first and the second transmission lines generally form the broadside-coupled transformer. The third transmission line is generally connected in series with the broadside-coupled transmission line forming a ground return path of the broadside-coupled transformer.

The objects, features and advantages of the present invention include providing a method and/or apparatus for implementing broadside-coupled transformers with improved bandwidth that may (i) be MMIC compatible, (ii) eliminate current combining problems in standard transformer structure at high frequency (half-wavelength) resonance, (iii) significantly extend the usable bandwidth of a transformer, (iv) improve lower frequency limit of transformer by physically lengthening the total length of the microstrip line from an input node to ground, (v) reduce or eliminate high frequency resonance in the transformer structure, (vi) provide a solution that works for all broadside-coupled transformers, and/or (vi) be independent of length and frequency range.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally provides a compact method for impedance matching active devices in MMIC based low noise amplifiers, power amplifiers, and phase shifters and attenuators over a significantly broader frequency range compared to standard matching approaches. In one embodiment, the present invention provides a novel but simple method to mitigate resonance and significantly extend the usable bandwidth of monolithic microwave integrated circuit (MMIC) broadside-coupled impedance transformers. A series of transformers designed in accordance with an example embodiment of the present invention, that were fabricated and characterized, are presented to demonstrate the improved performance.

The transformer has long been a useful tool for circuit designers. The classic transformer is commonly based on magnetically coupled coils. A ferromagnetic core couples a magnetic field between two coils of n:1 winding ratio. The classic transformer structure provides not only the ability to create (voltage) impedance transformation, but other structures such as baluns may also be constructed. Commercially available magnetically coupled transformers are typically only capable of operation at RF frequencies and can only handle limited power. Ferromagnetically coupled transformers are by default AC power transformers. The broadside coupled MMIC compatible transformers are also by default AC coupled power transformers. However, the ferromagnetically coupled wirewound core transformers can only handle (or transform) limited RF power (or signals) over a limited amplitude range. The ferromagnetically coupled wirewound core transformers are also limited in bandwidth because of the nature of their construction—coils of wire wrapped around an iron block.

Figure 1:
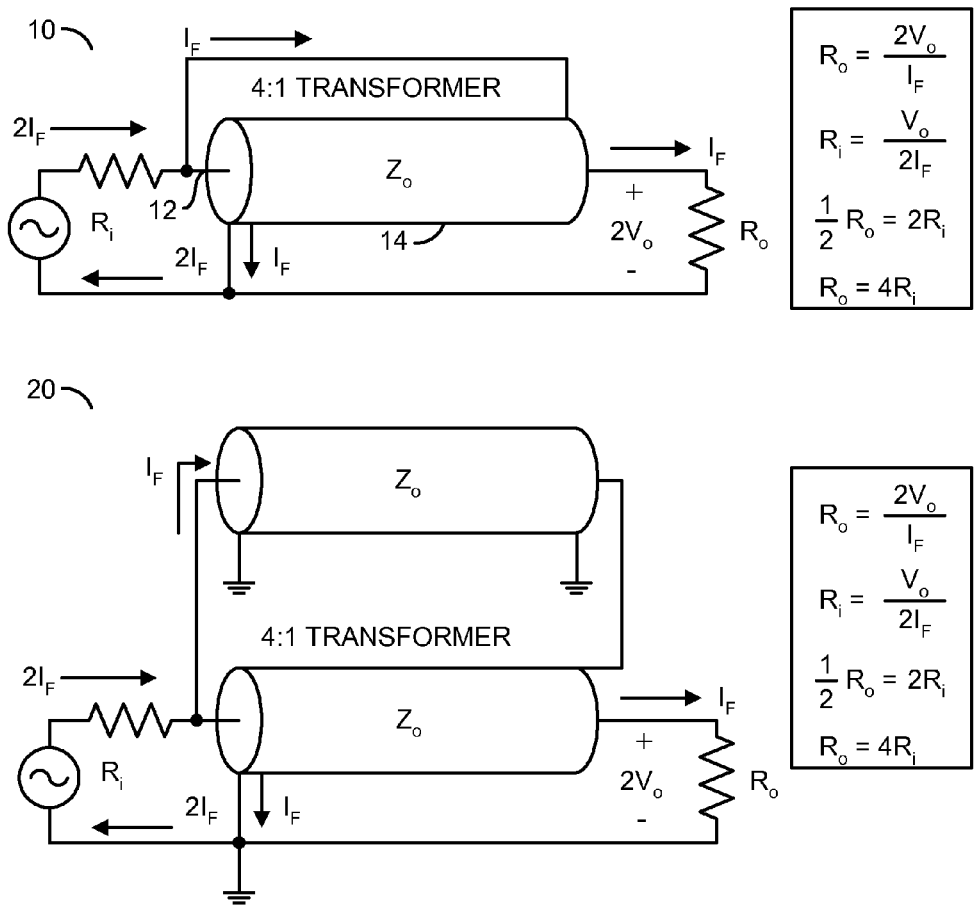
FIG. 1 is a diagram illustrating Ruthroff style and Guanella style coaxial transmission line based impedance transformers.

Referring to FIG. 1, a diagram is shown illustrating a 4:1 Ruthroff style transmission line impedance transformer 10 and a 4:1 Guanella style transmission line impedance transformer 20. Microwave frequency transformers may be constructed using transmission line based coupled structures, such as the Ruthroff style transformer or the Guanella transformer. One particular drawback of these types of transmission line based transformers is that transmission line based transformers are not monolithic microwave integrated circuit (MMIC) compatible.

The transmission line impedance transformer 10 of FIG. 1 has two main physical properties, electrical length and characteristic impedance, Zo. The transformer 10 may be configured as a 4:1 transformer. The 4:1 transformer configuration functions by impedance matching a source impedance of Ri to a load impedance of Ro over a frequency range that is largely dependant on the electrical length of the transmission line and the quality of the coupling between a center conductor 12 and a ground return path 14. The transformation property is created by interrupting the ground return path at the output and force feeding the ground current back into the input. The operating assumption is that the transmission line maintains a transverse electromagnetic field (TEM) structure, which then requires, due to enforcement of boundary conditions, a balanced current flow between the center conductor 12 and the ground return path 14.

Redirecting the ground return current at the output (which is forced to be equal to the current in the center conductor) and feeding the ground return current to the input has the effect of doubling the voltage (relative to the source ground) seen across the output load, Ro, and requiring twice the current from the source Ri. As a result, because of the balanced current in the transmission line and the feedback across the coupler, the ratio of the tuned optimum load impedance to the source impedance will be 4:1 with the transmission line characteristic impedance, Zo, being the geometric mean of the source and load impedances.

The Guanella style transmission line impedance transformer 20 provides improved bandwidth over the Ruthroff style transmission line impedance transformer 10. Guanella noticed that there is a phase imbalance between the current flowing in the coax transmission line and the forced return current from the floating ground shield at the high impedance end of the transformer. To improve the bandwidth of the Ruthroff transformer, Guanella introduced another transmission line, of equal length, to balance the phase of the current being fed from the output high impedance port back to the input low impedance port.

Figure 2:
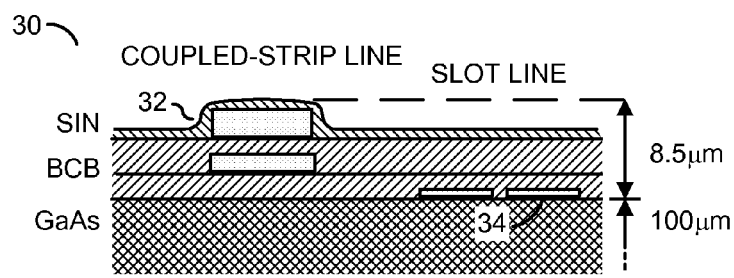
FIG. 2 is a diagram illustrating examples of broadside-coupled and edge-coupled transmission line transformers.

Referring to FIG. 2, a diagram of an integrated circuit 30 is shown illustrating a cross section of a three metal layer structure showing examples of broadside-coupled transmission lines (or microstrips) 32 and edge-coupled transmission lines (or microstrips) 34. The TEM coaxial structures shown in FIG. 1 cannot be implemented in a MMIC environment. Two typical forms of MMIC compatible transformers may be developed using coupled lines structures. One transformer type may be formed from edge-coupled interdigitated transmission lines and another transformer type may be based on broadside-coupled structures. Coupled line microstrip based transformers are generally capable of operating at microwave frequencies over broad bandwidths. Edge-coupled line based transformers suffer from limited bandwidth and higher loss compared to broadside-coupled line based transformers. Broadside-coupled transmission line based transformers offer the best combination of low loss and bandwidth, with MMIC compatibility. The broadside-coupled Ruthroff style transformer has the best bandwidth of any other type of MMIC compatible transformer.

Figure 3:
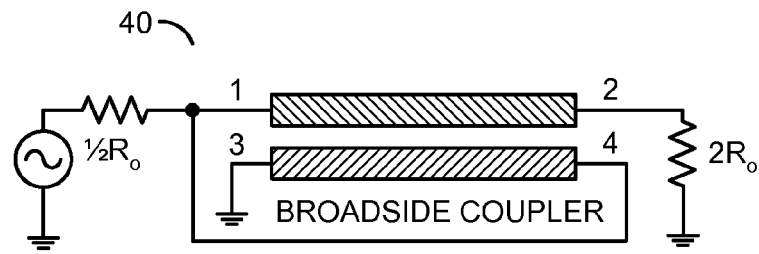
FIG. 3 is a diagram illustrating a Ruthroff style, microstrip, monolithic microwave integrated circuit (MMIC) compatible, broadside-coupled impedance transformer.
Figure 3:
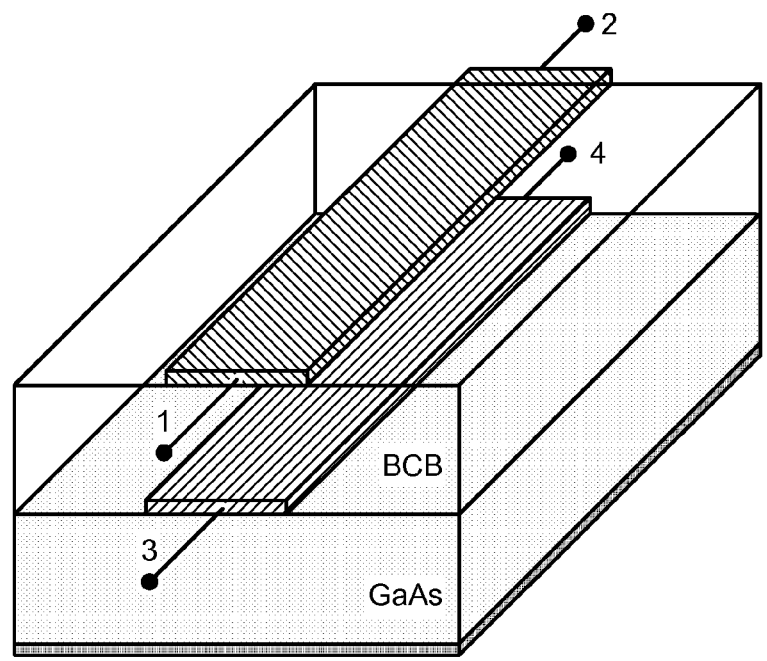
Figure 3:
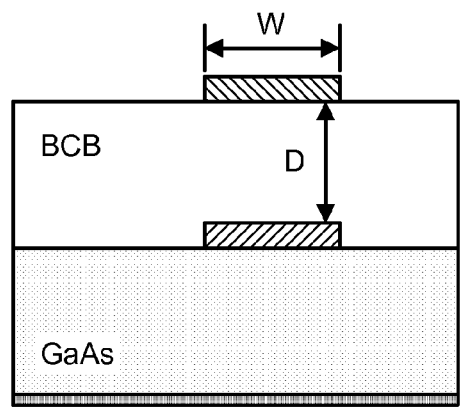

Referring to FIG. 3, a schematic diagram and cross section diagrams are shown illustrating an example Ruthroff style, microstrip MMIC compatible, broadside-coupled impedance transformer 40. There are two challenges that face engineers wishing to use broadside-coupled transformers in MMIC designs. The first challenge is the limited availability of process specific scalable models, and the second challenge is the limited availability of commercial MMIC processes that have adequate metallization capability for constructing broadside-coupled structures. The 4:1 Ruthroff style MMIC compatible broadside-coupled impedance transformer 40 generally has excellent broadband performance, but an inherent bandwidth limitation has been discovered.

The MMIC compatible broadside-coupled line transformer 40 is not a pure TEM mode transmission line structure and does not have the same ideal performance as the TEM coaxial structures illustrated in FIG. 1. A classic microstrip transmission line, within a planar MMIC environment, is a quasi-TEM guided wave structure, and does not have a ground return current path that can be isolated, such as with a coaxial transmission line structure. Therefore, the ability to control the ground return path in a MMIC environment is limited. The limited control of the ground return path limits the performance of broadside or edge-coupled structures in a MMIC environment.

Broadside-coupled lines are more tightly coupled than edge coupled structures and, therefore, may be used to construct higher performance, broader bandwidth impedance transformers. A MMIC based microstrip broadside-coupled structure places a controlled dielectric (e.g., benzocyclobutene (BCB) or polyimide) of thickness (D), between two metal traces of arbitrary, but design dependant, width (W), that sit atop the MMIC substrate material (e.g., gallium arsenide (GaAs), silicon (Si), gallium nitride (GaN), aluminum nitride (AlN), etc.). The substrate material may even be laminate, as long as there is the ability to form broadside-coupled structures. The broadside-coupled line allows one trace to effectively become a suspended ground that allows access to the return currents to implement the transformer 40 of FIG. 3. The dielectric thickness D and trace width W are critical (e.g., performance determinative) design parameters, because they determine the amount of coupling between the traces.

Figure 4:
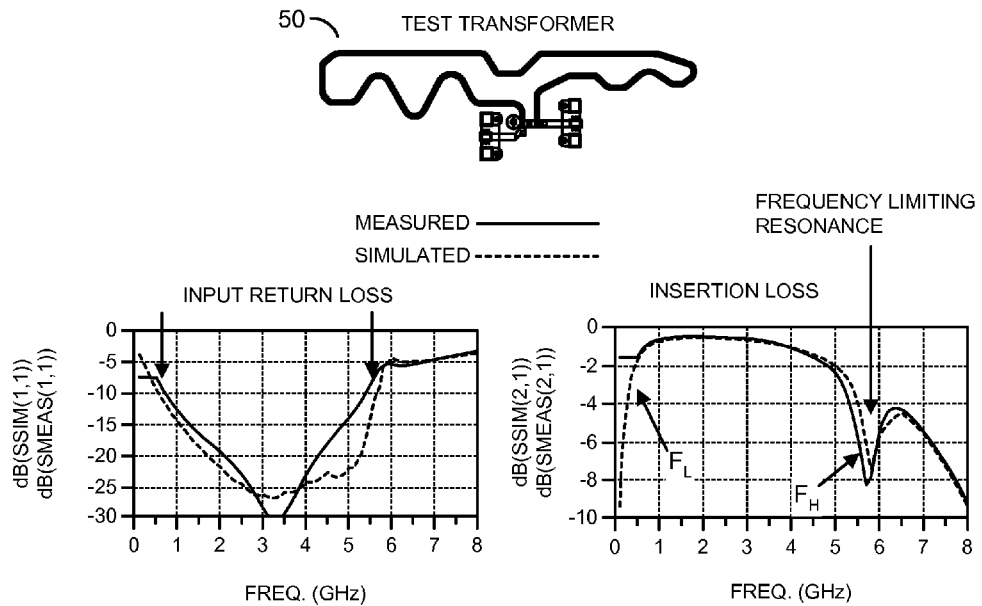
FIG. 4 is a diagram illustrating frequency limitations caused by half-wavelength resonance in a ground return path of the transformer of FIG. 3, using a real measured transformer.

Referring to FIG. 4, a diagram of a test transformer 50 is shown illustrating an example of measured versus simulated resonance in a real measured broadband impedance transformer. The transformer 50 illustrated was implemented with a length of 8.8 mm and a width of 45 um. The line resonance occurs at approximately 5.8 GHz. Simulation was performed using an electromagnetic (EM) simulator (e.g., Momentum from Agilent Technologies, Santa Clara, Calif.). With reference to the test transformer 50, the half-wavelength resonance occurs in the bottom grounded trace at approximately 5.8 GHz. The half-wavelength resonance creates a very low impedance (nearly a short circuit) at the input port of the transformer, causing a spike in the insertion loss. The frequency of the resonance ($F_H$) is a direct function of the length of the bottom trace and is purely design dependant, depending on the frequency band of the circuit that the transformer is being used in. The half-wavelength ($\lambda/2$) resonance limits the upper usable bandwidth of the transformer structure.

Figure 5:
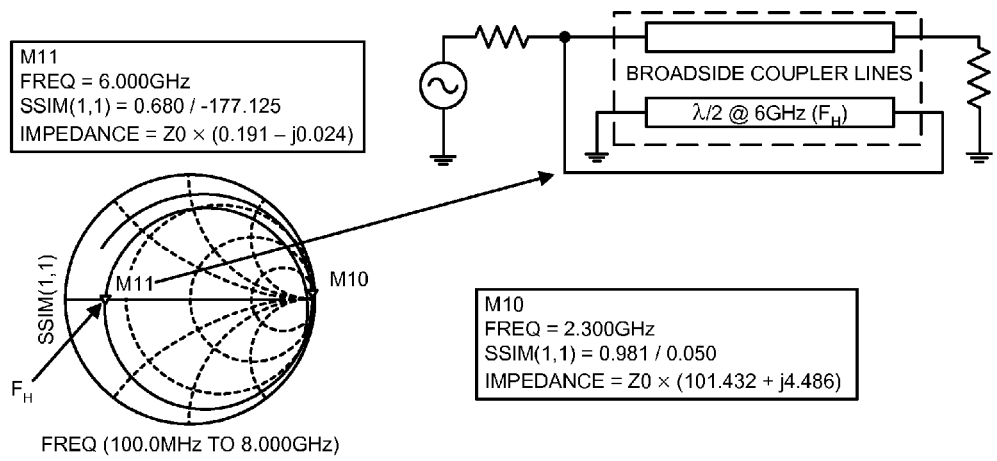
FIG. 5 is a diagram illustrating the resonance problem using the measured transformer example of FIG. 4.

Referring to FIG. 5, a polar plot is shown illustrating the resonance problem in a conventional transformer. Both the MMIC compatible broadside-coupled Ruthroff and Guanella transformers have an inherent bandwidth limitation due to a high frequency resonance (a zero in the network transmission characteristics) that occus when the ground conductor in the transformer reaches the half-wavelength frequency (e.g., $F_H$). With reference to the test transformer 50 of FIG. 4, the length of the transformer is a design variable that depends on the frequency of operation of the transformer in a desired application. The length of the transformer determines the half-wavelength frequency that creates a short circuit at the transformer input. The short circuit caused by the half-wavelength frequency limits the usable upper frequency range of the transformer and is the root cause of the upper frequency limitations of MMIC compatible transformers.

Figure 6:
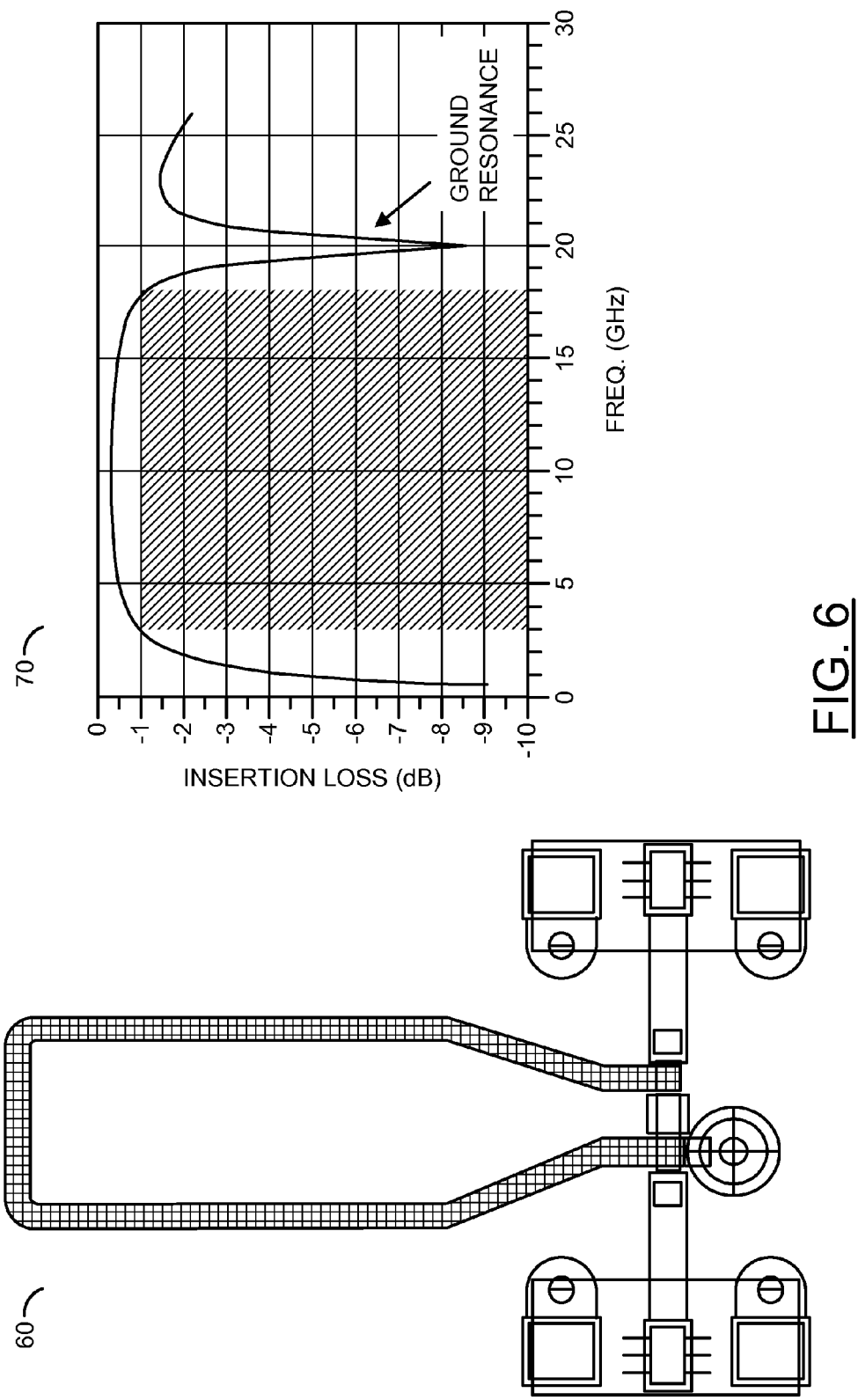
FIG. 6 is a diagram illustrating a MMIC compatible Ruthroff style impedance transformer layout used as a reference to determined improvements provided by transformer layouts in accordance with embodiments of the present invention.

Referring to FIG. 6, a diagram of a circuit layout 60 is shown illustrating an unmodified MMIC compatible Ruthroff style impedance transformer. The unmodified MMIC compatible Ruthroff style impedance transformer layout 60 was used as a reference to determine improvements resulting from modifications in accordance with an embodiment of the present invention. The design of a MMIC impedance transformer is application specific and outside the scope of this disclosure. However, the main design variables are dielectric thickness (assuming fixed permittivity), trace width, which controls the characteristic impedance, and trace length, which affects the operational frequency limits. A variety of broadside-coupled transformers such as the transformer layout 60 may be designed and tested for different applications (e.g., using M/A-COM Technology Solution's GaAs FAB, which provides an advanced multilevel metallization process). In all cases observed, the usable frequency range of the transformer seems to be limited by what appears to be a resonance in the higher frequency range, as demonstrated in a graph 70 at 20 GHz. For example, the transformer layout 60 was fabricated having a width of 35 um and a length of 2500 um. The fabricated transformer layout 60 was tested, and appears to have a usable tuned bandwidth of 3-18 GHz (illustrated by a shaded area in the graph 70). The transformer 60 demonstrates a significant increase in insertion loss at 20 GHz. The type of high frequency resonance demonstrated by the transformer 60 occurs in all Ruthroff style broadside-coupled MMIC transformers and limits the usable bandwidth. The present invention generally provides a simple solution that may mitigate the bandwidth limitation.

During the process of developing a scalable model for a four port broadside coupler specific to the M/A-COM Technology Solutions FAB, it was discovered that the high frequency resonance in all transformer designs was being caused by the ground trace, as part of the coupled structure, going into half-wavelength resonance. Using the nomenclature of FIG. 3 and the specific example shown in FIG. 6, the transformer 60 is grounded at port 3 and connected through port 4 directly to the input of the transformer at port 1 through the full length of the trace. The half-wavelength resonance of the ground trace occurs at 20 GHz (as shown in the graph 70) and presents a short circuit at the input of the transformer at port 1. The half-wavelength short circuit occurring at the input of the transformer is the primary cause of the 20 GHz performance problem and significantly limits the usable bandwidth of not only the specific transformer illustrated in FIG. 6, but all transformers of similar conventional style.

Figure 7:
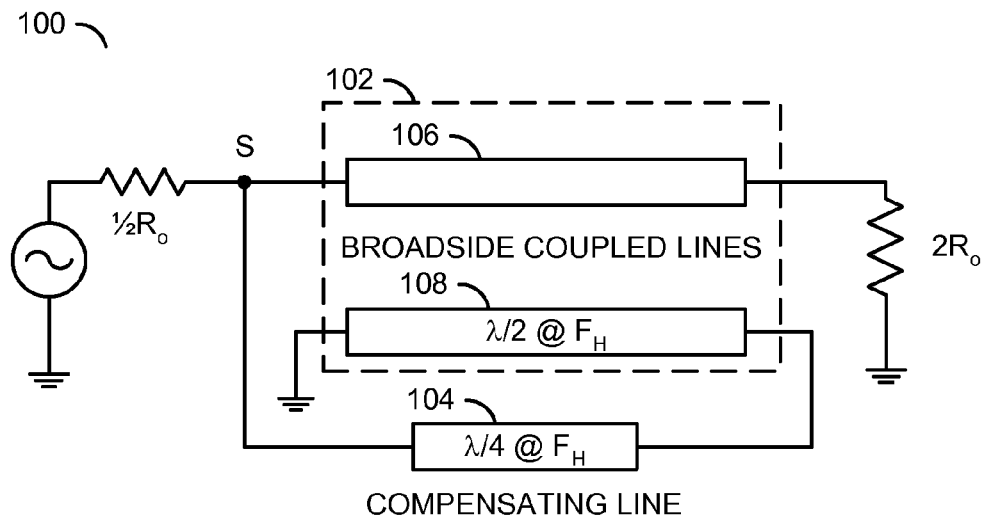
FIG. 7 is a schematic diagram illustrating a modified Ruthroff style impedance transformer in accordance with an example embodiment of the present invention.

Referring to FIG. 7, a schematic diagram of a circuit 100 is shown illustrating a broadside-coupled, MMIC compatible, Ruthroff style impedance transformer modified in accordance with an example embodiment of the present invention.

In one example, the circuit 100 may be implemented as a Ruthroff style transformer comprising a broadside-coupled structure 102 and a compensating structure 104. The broadside-coupled structure 102 generally comprises an upper microstrip line 106 and a lower microstrip line 108. The lower microstrip line 108 is generally connected to provide the ground return path of the Ruthroff style transformer. The compensating structure 104 may be implemented as a microstrip line. The compensating structure 104 may be configured to have a quarter-wavelength frequency at the frequency, $F_H$, where the ground return path 108 has its half-wavelength resonance.

After investigating the nature of the high frequency resonance and confirming the cause of the high frequency resonance, a novel and elegantly effective improvement was discovered, which mitigates the high frequency resonance in the Ruthroff/Guanella style transformers. Introduction of the compensating structure 104 in series with the ground return path 108 and external to the coupled structure 102, generally reduces or eliminates the resonance that limits the usable bandwidth of the Ruthroff/Guanella style transformers. The insertion of the quarter-wavelength ($\lambda/4$) compensating line 104, outside the coupled lines 102, generally transforms the short circuit caused by the half-wavelength resonance in the ground path 108, into an open circuit at the input of the circuit 100, which mitigates the short circuiting effect.

Upon initial analysis, it seems theoretically inappropriate to insert the compensating line 104 into the ground return path to transform the short into an open and still presume that the broadside-coupled structure 102 will function as a transformer. When the ground return path looks like an open to the input of the transformer, the source should not be able to deliver current into the ground path, which is necessary to create the impedance transformation. If the coupled lines 106 and 108 were purely TEM structures, as with coaxial transmission lines, this conclusion would be true. However, the broadside-coupled lines 106 and 108 are weakly TEM, and at higher frequencies, where the coupled lines 106 and 108 resonate, the circuit 100 is no longer functioning as a transformer in the classic sense, as previously described. However, with the introduction of the external compensating line 104, at high frequencies, the circuit 100 is still acting as a transformer and significant bandwidth may be recovered. The root cause of this phenomenon may be taken advantage of for practical design purposes.

The circuit 100 generally eliminates the current combining problems in a standard transformer structure that generally occur at the input (e.g., node "S") at the high frequency (e.g., half-wavelength) resonance and significantly extends the usable bandwidth of the transformer. The addition of the compensating structure 104 not only improves the usable bandwidth range at the higher frequencies, but also improves the bandwidth in the lower frequency range. By placing a transmission line extension of a length that is "near" a quarter wavelength (at approximately the same frequency, $F_H$, at which the grounded trace in the broadside-coupled line structure 102 goes into half-wavelength resonance) outside of the broadside-coupled structure 102, the high frequency resonance that occurs in the transformer structure may be eliminated and the combined currents at the input node, S, may be balanced (even through the half-wavelength resonance frequency of the broadside-coupled structure 102).

The circuit 100 is not the same as a Guanella style transformer. The Guanella transformer, implemented using broadside-coupled lines, suffers from the same resonance problem and has the same solution, albeit a little more complicated to implement. By tuning the resonance cancellation method, the Ruthroff style transformer 100 may be used over a significantly broader bandwidth. The modification in accordance with the present invention generally makes the transformer better in the sub-band for which the transformer is designed. The Ruthroff style transformer 100 with the new half-wavelength resonance cancellation has over a decade of usable bandwidth. The transformer modifications in accordance with the present invention may be used in power amplifier designs, and possibly also employed in other circuit areas such as phase shifters, attenuators, and/or low noise amplifiers (LNAs).

Figure 8:
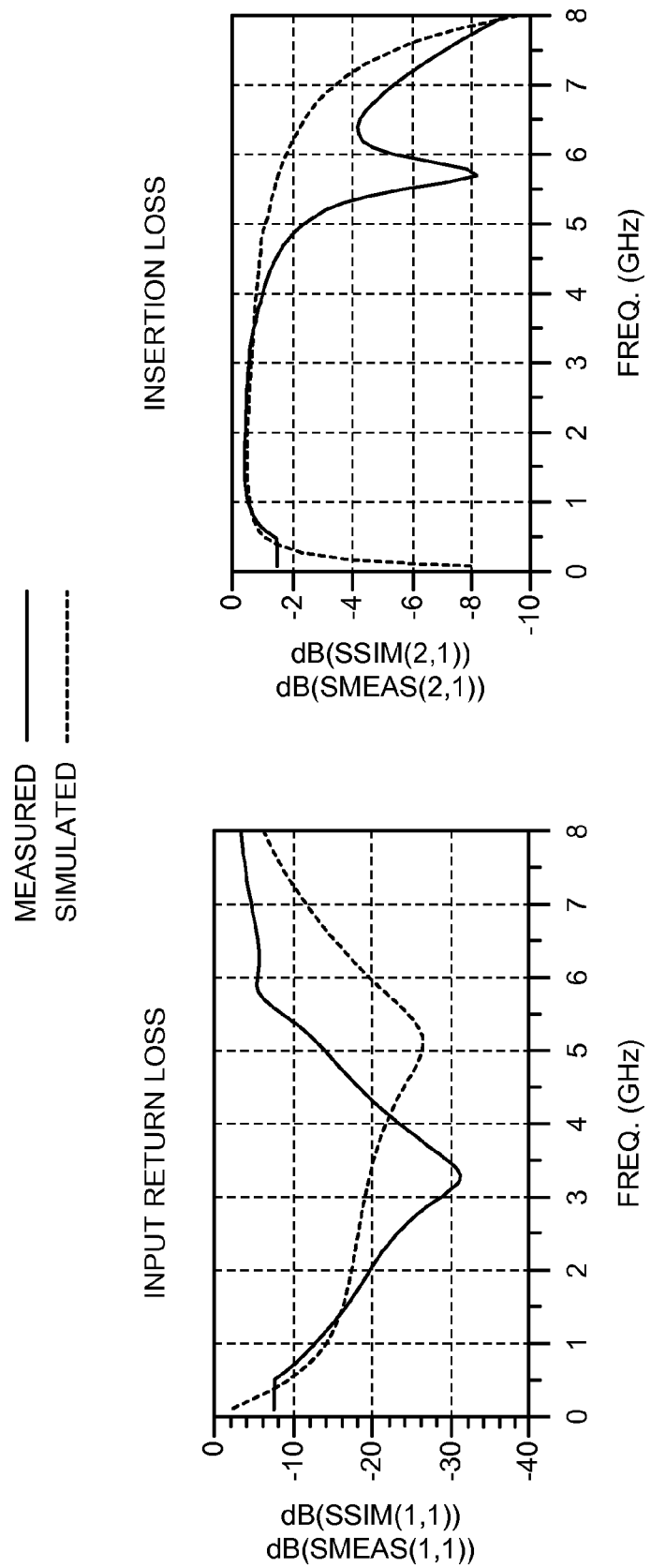
FIG. 8 shows graphs of input return loss and insertion loss of the measured transformer shown in FIG. 4 compared to an electromagnetic simulation of a resonance compensated transformer as shown in FIG. 7.

Referring to FIG. 8, a graph of input return loss and a graph of insertion loss are shown illustrating simulated results of the modified transformer 100 of FIG. 7 compared with measured results of the unmodified transformer (described above in connection with FIG. 4). The usable frequency range of the unmodified (measured) transformer (e.g., defined by the frequency range where the input return loss is better than 10 dB) is about 0.6 GHz to 5.5 GHz, but the insertion loss increases significantly at 5.5 GHz and is not practically usable above about 4.5-5 GHz. When the transformer is modified in accordance with the example embodiment of the present invention, the resonance is eliminated (as shown by the simulated insertion loss curve) and the usable bandwidth is extended from 0.5 GHz to about 7.2 GHz, using the 10 dB return loss rule for defining usable bandwidth. The innovation provided by the present invention generally works for all broadside-coupled transformers, independent of length and frequency range. The half-wavelength resonance is fundamental to the standard broadside-coupled transformer configuration. The modification in accordance with the present invention generally works for all transformer designs across any frequency range and material parameter variation.

Figure 9:
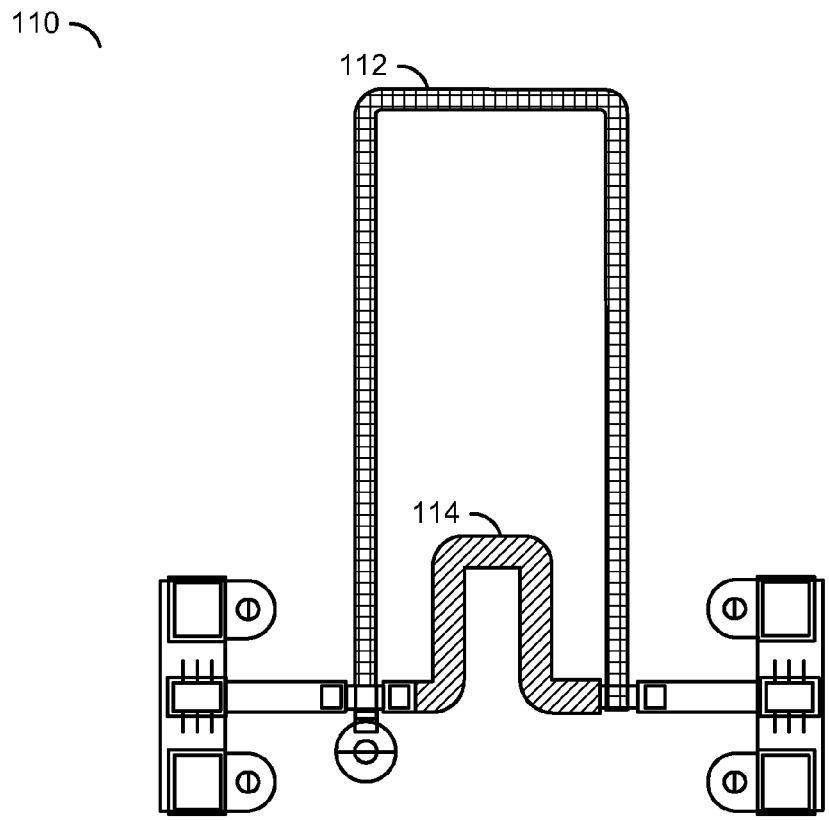
FIG. 9 is a diagram illustrating a MMIC compatible modified Ruthroff style impedance transformer layout in accordance with an example embodiment of the present invention.

Referring to FIG. 9, a diagram is shown illustrating a MMIC compatible, broadside-coupled transmission line transformer (TLT) layout 110 in accordance with an example embodiment of the present invention. The TLT layout 110 generally comprises a broadside-coupled structure 112 and a compensating line 114. The broadside-coupled structure 112 generally comprises a pair of broadside-coupled transmission lines. The pair of broadside-coupled transmission lines are generally separated by a controlled thickness of dielectric (e.g., similar to the lines illustrated in FIG. 3). The compensating line 114 generally improves the bandwidth of the transformer 110 by introducing an impedance controlled line in the ground path that has an electrical length of about one-quarter wavelength ($\lambda/4$) at the half-wavelength ($\lambda/2$) frequency, $F_H$, of the broadside-coupled line forming the ground return path of the broadside-coupled structure 112. The TLT layout 110 also makes the transformer more friendly in MMIC applications by physically separating the RF input and the RF output ports of the layout.

Figure 10:
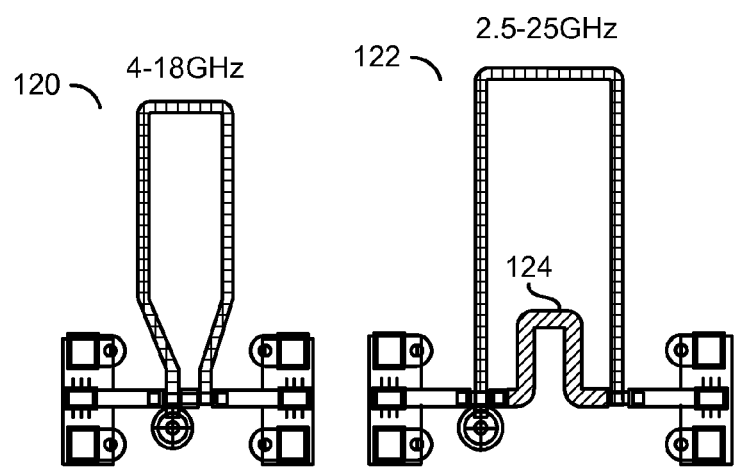
FIG. 10 is a diagram illustrating a comparison between compensated and uncompensated transformer performance.
Figure 10:
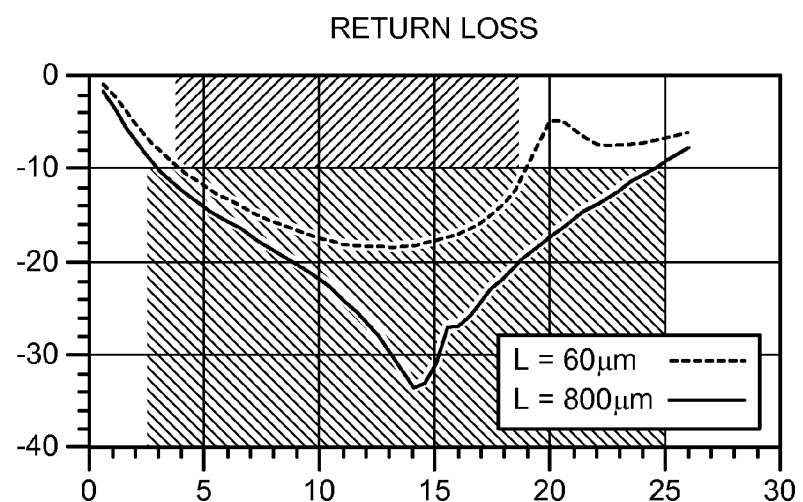
Figure 10:
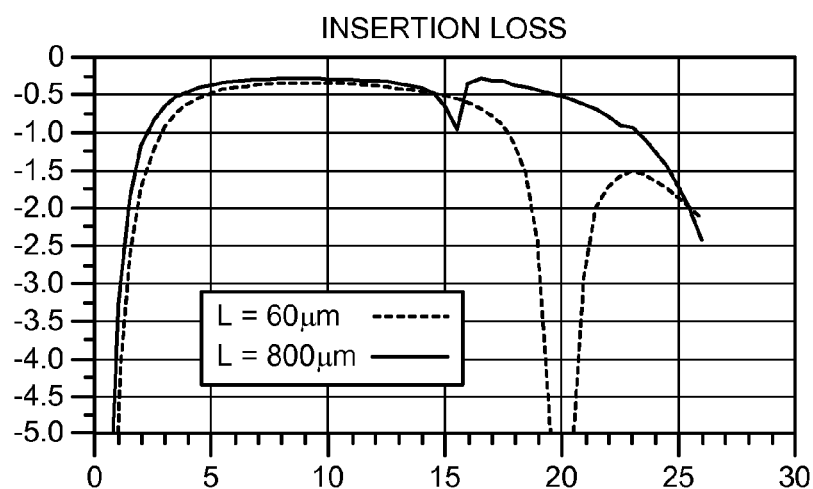

Referring to FIG. 10, a diagram of is shown illustrating a comparison between compensated and uncompensated transformer performance. In one example, an uncompensated transformer 120 may be implemented using the circuit layout 60 of FIG. 6 and a compensated transformer 122 may be implemented using the circuit layout 110 of FIG. 9. The compensated transformer 122 may include a 56 um wide line 124 having a length of ~800 um introduced into the ground return path of the transformer. The uncompensated transformer 120 only has a usable bandwidth of 4-18 GHz based on a 10 dB return loss (illustrated by the upper cross-hatched area in the graph of return loss). The compensated transformer 122 with the 800 um compensating line 124 generally shows a significantly better bandwidth (illustrated by the lower cross-hatched area in the graph of return loss). The compensating line 124 generally provides the better bandwidth by shifting the 20 GHz resonance to 15 GHz and minimizing the effects of the resonance on return loss and insertion loss. When the length of the compensating line 124 is increased to about 1400 um, the resonance may be eliminated (as demonstrated by the simulated results illustrated in FIG. 16 below).

Figure 11:
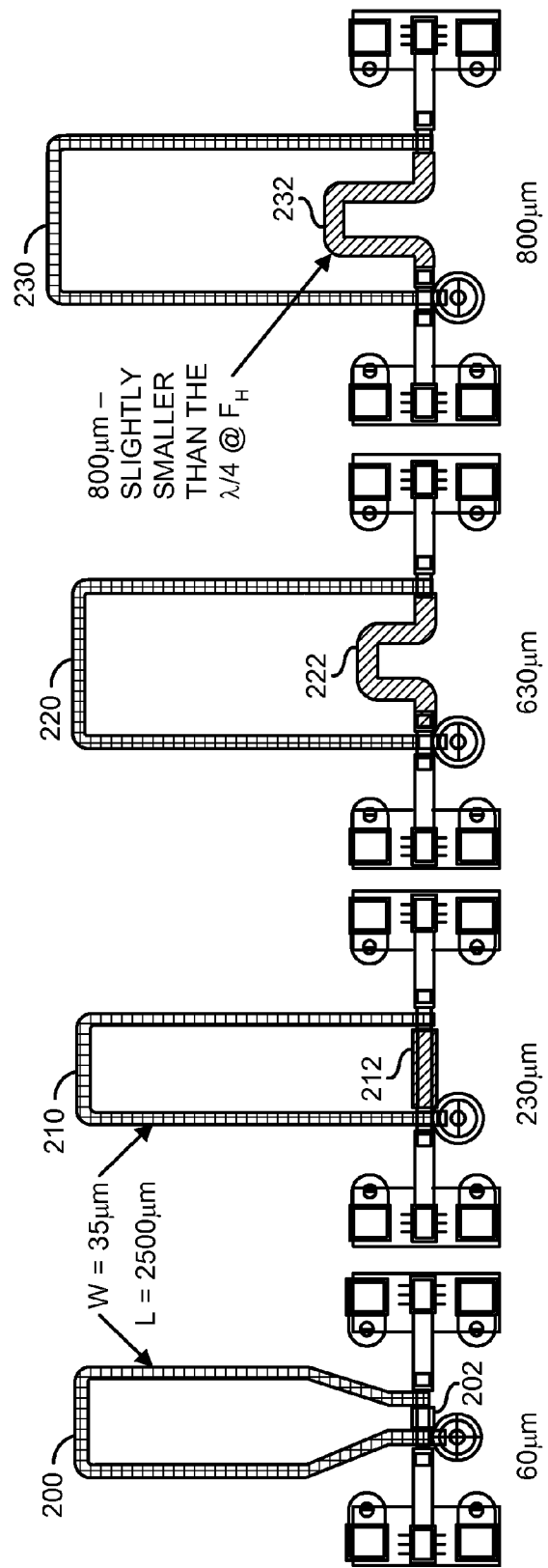
FIG. 11 is a diagram illustrating a number of transformer experiments demonstrating compensating line effectiveness.

Referring to FIG. 11, a diagram is shown illustrating a series of four broadside-coupled 4:1 transformers that were used to demonstrate the effectiveness of improving the operational bandwidth of the MMIC Ruthroff style transformer by introducing a resonance compensating line in accordance with an example embodiment of the present invention. The series of transformers were designed, fabricated (e.g., using the M/A-COM Technology Solutions' FAB), and measured. The series of transformers includes a first transformer 200 implemented with the circuit layout 60 and three other transformers (210, 220, and 230) implemented with the circuit layout 100 and having compensating structures (212, 222, 232) of different lengths. The broadside-coupled transformer 200 has broadside-coupled lines that are 35 um wide and 2500 um long. The first broadside-coupled transformer 200 was fabricated with an external compensating line 202 having a length of 60 um (since 0 um is not physically realizable) and approximates a conventional (unmodified) transformer. The remaining transformers 210, 220, and 230 also have broadside-coupled lines that are 35 um wide and 2500 um long, and were fabricated with the external compensating lines 212, 222, and 232 having lengths of ~230 um, ~630 um, and ~800 um, respectively. The transformers 200, 210, 220, and 230 were measured (e.g., S-parameters) using a precision on-wafer through reflect line (TRL) de-embedding system. The de-embedded data for the transformers 200, 210, 220, and 230 were imported into an electronic design automation software for RF, microwave, and high speed digital applications (e.g., Advanced Design System (ADS), Agilent Technologies, Santa Clara, Calif.) for analysis.

The 4:1 transformers 200, 210, 220, and 230 are not matched to 50Ω by definition, therefore the reference port terminations used to calculate (or renormalize) the two port S-parameters of the transformers are tuned within the electronic design automation software to yield simultaneous optimum input and output return loss and minimum insertion loss across the widest possible bandwidth. This figure of merit is somewhat qualitative because there is no single perfect answer, only a range of tuning impedances that yield slightly different tradeoffs in overall transformer performance. In one example, the optimum input reference impedance was found to be about 17Ω and the optimum output reference impedance was found to be about 67Ω, which is approximately a 4:1 ratio. The characteristic impedance of the transformer is determined as the geometric mean of the input and output terminating impedances, or $\sqrt{(17 \cdot 67)}=33.7\Omega$. The same terminating impedances were applied to all transformer variants and the results compared.

Figure 12:
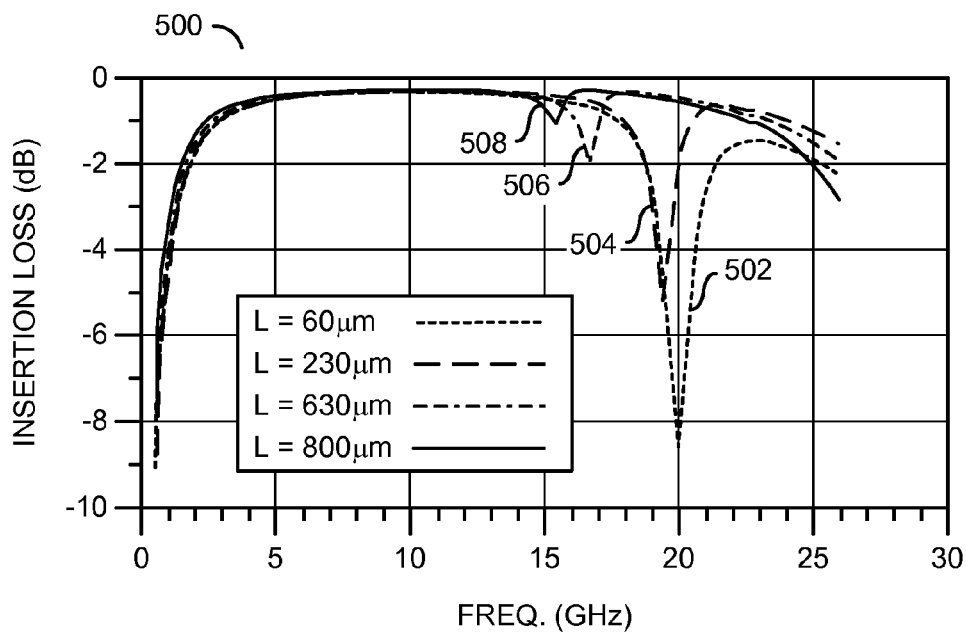
FIG. 12 is a diagram illustrating a measured transformer insertion loss as a function of increasing length of a compensation line.

Referring to FIG. 12, a diagram is shown comparing the insertion loss of the transformers of FIG. 11 as a function of the length, L, of the respective compensating line. A curve 502 generally illustrates the insertion loss for the transformer 200. A curve 504 generally illustrates the insertion loss for the transformer 210. A curve 506 generally illustrates the insertion loss of a transformer 220. A curve 508 generally illustrates the insertion loss of a transformer 230. From the graph 500, the ground resonance moves from 20 GHz to almost 15 GHz and the effect (or amplitude) of the resonance on the insertion loss decreases significantly as the length of the compensating line increases from 60 um to 800 um. Using an electromagnetic simulator, the optimum length of the compensating line was determined to be approximately 1200-1400 um. However, with an 800 um compensating line, the negative effects of the 15 GHz ground resonance are almost completely eliminated. In general, the propagation constant of a microstrip transmission line and the broadside-coupled transformer are not the same, so the length of the compensating line should not necessarily be one-half of the length of the transformer. However, in practice, for typical transformers, using a compensation line length that is one-half of the length of the transformer is a reasonably close approximation and not highly sensitive to variability.

Figure 13:
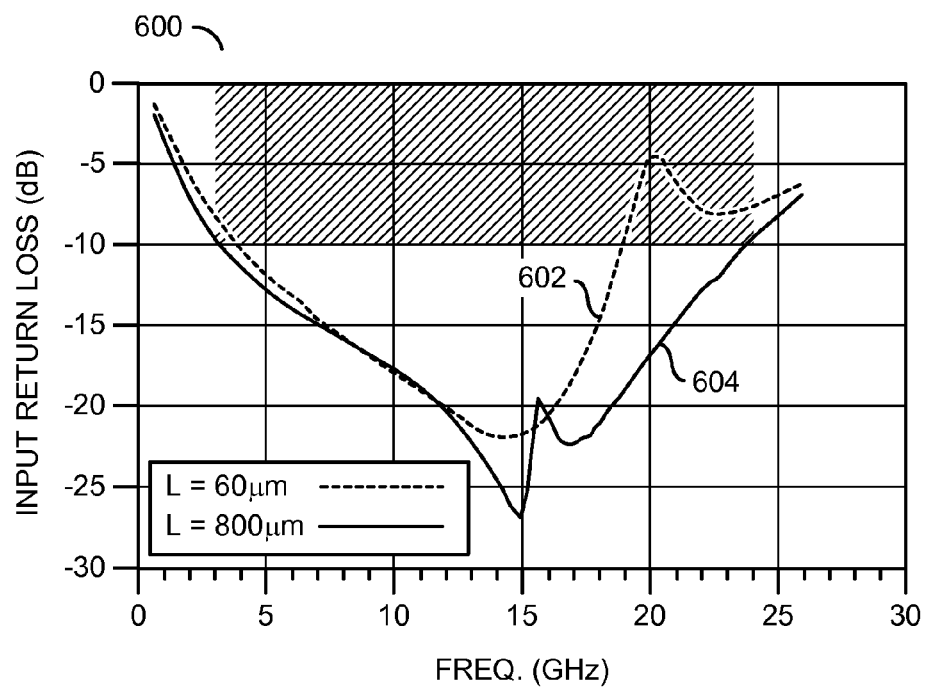
FIG. 13 is a diagram illustrating a measured input return loss of compensated and non-compensated transformers.
Figure 14:
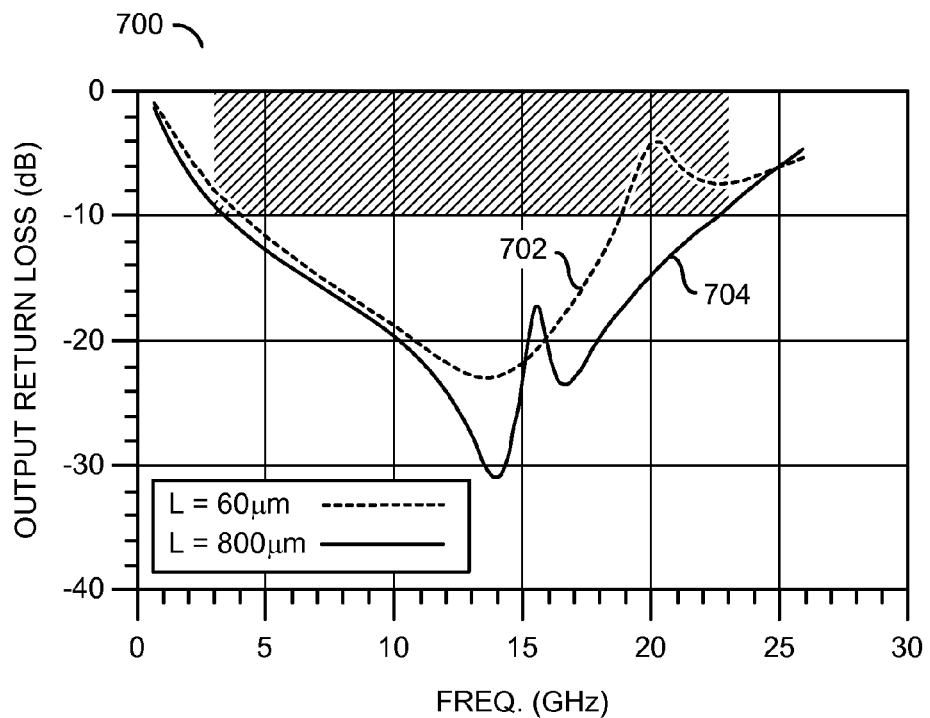
FIG. 14 is a diagram illustrating a measured output return loss of compensated and noncompensated transformers.

Referring to FIGS. 13 and 14, graphs 600 and 700, respectively, are shown generally comparing the measured input return loss (FIG. 13) and output return loss (FIG. 14) of (a) the tuned transformer 230 with ground resonance compensation and (b) the tuned transformer 200 without ground resonance compensation. With respect to FIG. 13, a curve 602 generally illustrates the input return loss for a baseline transformer 200 and a curve 604 generally illustrates the input return loss for the compensated transformer 230. With respect to FIG. 14, a curve 702 generally illustrates the output return loss for the transformer 200 and a curve 704 generally illustrates the output return loss for the compensated transformer 230. Only the baseline transformer (L=60 um) and the best performing compensated transformer design (L=800 um) are compared to more clearly demonstrate the effectiveness of adding a quarter-wavelength compensating line. Using 10 dB as the figure of merit (as a measure of how well the transformer is matched to its terminating impedances), the return loss indicates that the compensated transformer 230 has approximately 40% greater usable bandwidth than the uncompensated transformer 200.

Figure 15:
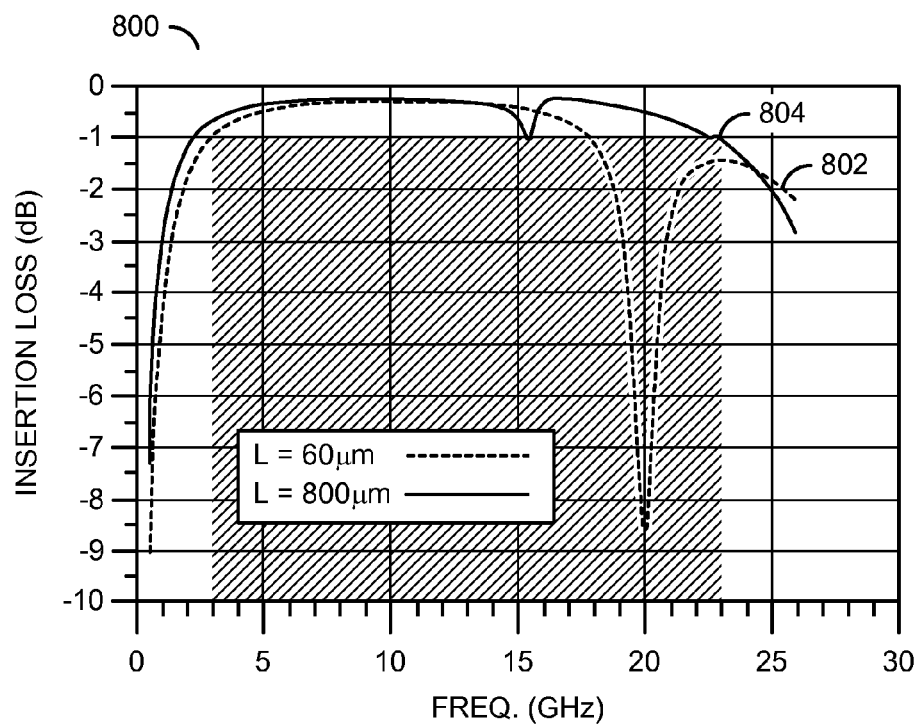
FIG. 15 is a diagram illustrating a measured insertion loss of compensated and non-compensated transformers.

Referring to FIG. 15, a graph 800 is shown illustrating the measured insertion losses of the baseline transformer 200 (curve 802, L=60 um) and the best performing compensated transformer design 230 (curve 804, L=800 um). Based upon the measured insertion loss, the compensated transformer 230 (L=800 um) has significantly reduced the effect of the ground resonance and created new usable bandwidth. The uncompensated transformer 200 (L=60 um) only has usable bandwidth from approximately 3-18 GHz. In contrast, the compensated transformer 230 (L=800 um) has usable bandwidth from approximately 2-23 GHz (illustrated by a cross-hatched area). The addition of the compensating line not only improves the usable bandwidth range at the higher frequencies, but also improves the bandwidth in the lower frequency range.

Figure 16:
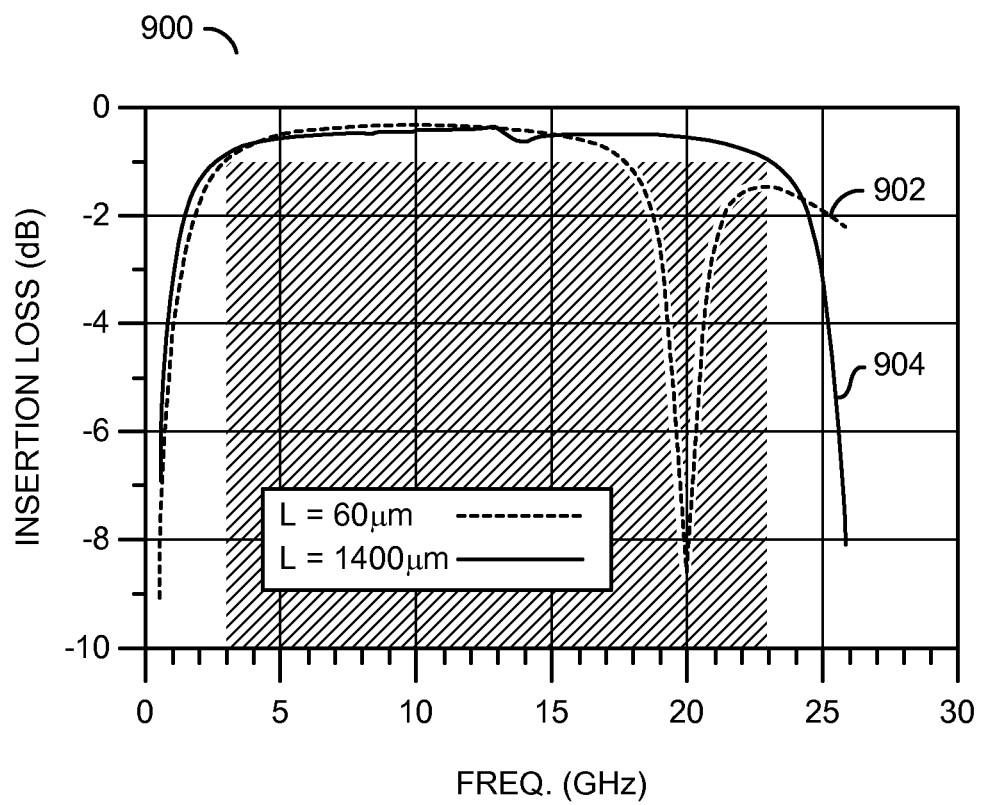
FIG. 16 is a diagram illustrating a measured input return loss of compensated and non-compensated transformers.

Referring to FIG. 16, a graph 900 is shown illustrating a comparison of the measured insertion loss of the baseline transformer 200 (L=60 um) and a simulated fully compensated transformer design (L=1400 um). The compensated transformer 230 with the L=800 um compensation line was imported into an EM simulator, the compensation line increased to 1400 um, and the transformer EM simulated to compare against the measured data. A curve 902 illustrates the insertion loss measured for the transformer 200. A curve 904 generally illustrates the simulated insertion loss for a transformer having a compensation line with a length 1400 um. The longer (L=1400 um) compensating line almost completely eliminates the effect of the ground resonance, even more effectively than the L=800 um case shown in FIG. 15. Further electromagnetic simulations indicate that the width of the compensating line may be tuned to optimize the transformer performance.

The MMIC compatible Ruthroff style broadside-coupled impedance transformer is found to have a high frequency bandwidth limitation. This limitation is caused by the ground return path reaching the half-wavelength resonance frequency, which creates a short circuit at the input of the transformer. A novel but simple solution in accordance with an example embodiment of the present invention effectively eliminates the negative effects of the resonance and significantly extends the usable frequency range of the transformer. A compensating microstrip line that is a quarter-wavelength long at the same frequency as the ground resonance may be added in series with the ground path. The usable bandwidth of the MMIC compatible Ruthroff style broadside-coupled transformer may be improved by up to 40% by modification in accordance with the teachings presented herein.

The modified transformer in accordance with embodiments of the present invention generally eliminates the current combining problems in the standard transformer structure (e.g., that may occur at the input node "S" in FIG. 7) at its high frequency (half-wavelength) resonance and significantly extends the usable bandwidth of the transformer. The lower frequency limit of the transformer may also be improved slightly, by physically lengthening the total length of the microstrip line from the input node "S" to ground.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to the preferred embodiments thereof, it will be understood by those skilled in the art that various changes in form and details may be made without departing from the scope of the invention.

The invention claimed is:

1. A monolithic microwave integrated circuit (MMIC) compatible broadside-coupled transformer comprising:
   a first transmission line;
   a second transmission line; and
   a third transmission line, wherein the first and the second transmission lines form the broadside-coupled transformer and said third transmission line (i) is connected in series with the broadside-coupled transmission line forming a ground return path of the broadside-coupled transformer and (ii) has an electrical length of about one quarter wavelength at the half-wavelength freguency of the broadside-coupled transmission line forming the ground return path of the broadside-coupled transformer.

2. The monolithic microwave integrated circuit (MMIC) compatible transformer according to claim 1, wherein said third transmission line is configured to reduce a half-wavelength resonance of the broadside-coupled transmission line forming the ground return path of the broadside-coupled transformer.

3. The monolithic microwave integrated circuit (MMIC) compatible transformer according to claim 1, wherein said third transmission line is outside the broadside-coupled structure formed by the first and the second transmission lines.

4. The monolithic microwave integrated circuit (MMIC) compatible transformer according to claim 1, wherein said first and said second transmission lines are separated by a controlled dielectric thickness.

5. The monolithic microwave integrated circuit (MMIC) compatible transformer according to claim 1, wherein said MMIC implements a device selected from the group consisting of a low noise amplifier, power amplifier, phase shifter and attenuatator.

6. The monolithic microwave integrated circuit (MMIC) compatible transformer according to claim 1, wherein said MMIC compatible transformer impedance matches one or more active devices in said MMIC.

7. The monolithic microwave integrated circuit (MMIC) compatible transformer according to claim 1, wherein said third transmission line physically separates a radio frequency (RF) input of said transformer from an RF output of said transformer.

8. The monolithic microwave integrated circuit (MMIC) compatible transformer according to claim 1, wherein said third transmission line has a physical length ranging from about one-quarter to about one-half of a physical length of the broadside-coupled transformer.

9. The monolithic microwave integrated circuit (MMIC) compatible transformer according to claim 1, wherein said first and said second transmission lines are separated by a dielectric.

10. The monolithic microwave integrated circuit (MMIC) compatible transformer according to claim 9, wherein said dielectric comprises at least one of benzocyclobutene or polyimide.

11. A method of reducing a half-wavelength resonance of a broadside-coupled transformer comprising:
   forming a first transmission line on a substrate;
   depositing a dielectric layer;
   forming a second transmission line on said dielectric layer; and
   forming a third transmission line, wherein the first and the second transmission lines form the broadside-coupled transformer and said third transmission line (i) is connected in polyimide. series with the broadside-coupled transmission line forming a ground return path of the broadside-coupled transformer and (ii) has an electrical length of about one quarter wavelength at the half-wavelength frequency of the broadside-coupled line forming the ground return path of the broadside-coupled transformer.

12. The method according to claim 11, wherein said third transmission line is configured to reduce a half-wavelength resonance of the broadside-coupled transmission line forming the ground return path of the broadside-coupled transformer.

13. The method according to claim 11, wherein said third transmission line is disposed outside the broadside-coupled structure formed by the first and the second transmission lines.

14. The method according to claim 11, wherein said first and said second transmission lines are separated by a controlled dielectric thickness.

15. The method according to claim 11, wherein said dielectric layer comprises at least one of benzocyclobutene or polyimide.

16. The method according to claim 11, wherein said third transmission line physically separates a radio frequency (RF) input of said transformer from an RF output of said transformer.

17. The method according to claim 11, wherein said third transmission line has a physical length ranging from about one-quarter to about one-half of a physical length of the broadside-coupled transformer.

18. The method according to claim 11, wherein said broadside-coupled transformer is part of a monolithic microwave integrated circuit (MMIC).

19. The method according to claim 18, wherein said MMIC implements a device selected from the group consisting of a low noise amplifier, power amplifier, phase shifter and attenuatator.

20. The method according to claim 18, wherein said MMIC compatible transformer impedance matches one or more active devices in said MMIC.

* * * * *